United States Patent
Terui et al.

(10) Patent No.: US 7,067,357 B2
(45) Date of Patent: Jun. 27, 2006

(54) SEMICONDUCTOR PACKAGE AND METHOD OF FABRICATING SAME

(75) Inventors: Makoto Terui, Yamanashi (JP); Takahiro Oka, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 359 days.

(21) Appl. No.: 10/810,600

(22) Filed: Mar. 29, 2004

(65) Prior Publication Data

US 2004/0183175 A1 Sep. 23, 2004

Related U.S. Application Data

(62) Division of application No. 10/022,268, filed on Dec. 20, 2001.

(30) Foreign Application Priority Data

Aug. 10, 2001 (JP) .................................... 2001-243274

(51) Int. Cl.
*H01L 21/50* (2006.01)

(52) U.S. Cl. ...................... 438/123; 257/666; 257/668; 257/669; 257/670

(58) Field of Classification Search ................. 257/666, 257/667, 678, 679, 680, 698, 673, 676; 438/123
See application file for complete search history.

(56) References Cited

U.S. PATENT DOCUMENTS

| | | | |
|---|---|---|---|
| 5,999,413 A | * | 12/1999 | Ohuchi et al. ............... 361/772 |
| 6,187,612 B1 | | 2/2001 | Orcutt |
| 6,392,158 B1 | | 5/2002 | Caplet et al. |
| 6,534,337 B1 | * | 3/2003 | Mahle et al. ............... 438/106 |
| 2001/0013645 A1 | * | 8/2001 | King et al. ................ 257/678 |
| 2002/0027441 A1 | | 3/2002 | Akram et al. |

FOREIGN PATENT DOCUMENTS

| | | |
|---|---|---|
| JP | 05-036894 | 2/1993 |
| JP | 08-306853 | 11/1996 |
| JP | 11-274367 | 10/1999 |
| JP | 11-345899 | 12/1999 |
| JP | 2000-326144 | 8/2000 |

* cited by examiner

*Primary Examiner*—Long Pham
*Assistant Examiner*—Nathan W. Ha
(74) *Attorney, Agent, or Firm*—Rabin & Berdo, P.C.

(57) ABSTRACT

A semiconductor package includes a semiconductor chip provided with a plurality of electric terminals and a plurality of electrically conductive members electrically connected with the electric terminals. Connection terminals that are spherical in shape and made of solder are electrically connected with the electrically conductive members. A sealing member is used for sealing the semiconductor chip and the electrically conductive members, and for covering the connection terminals so as to allow a part thereof to be exposed. The electrically conductive members are provided with bonding promoters and are connected with the respective spherical connection terminals at the respective bonding promoters.

15 Claims, 6 Drawing Sheets

PACKAGE (1)

PACKAGE (1)

SECOND EMBODIMENT

PACKAGE (2)

THIRD EMBODIMENT

FORTH EMBODIMENT

FIFTH EMBODIMENT

SEMICONDUCTOR PACKAGE AND METHOD OF FABRICATING SAME

CROSS-REFERENCE TO RELATED APPLICATION

This is a division of application Ser. No. 10/022,268, filed Dec. 20, 2001.

BACKGROUND OF THE INVENTION

1. Field of the Invention

The invention relates to a semiconductor package and a method of fabricating the same, and in particular, to a ball grid array package, and a method of fabricating the same.

This application is a counterpart of Japanese Patent Application, Serial Number 243274/2001, filed Aug. 10, 2001, the subject matter of which is incorporated herein by reference.

2. Description of the Related Art

A conventional method of fabricating a semiconductor package is disclosed in Japanese Patent Laid-Open No. 274367/1999. The conventional semiconductor package comprises a lead frame on which solder balls are formed, a first molding die member in which cavities for receiving the solder balls are formed, and a second molding die member to be engaged with the first molding die member. The conventional method of fabricating the semiconductor package comprises the steps of disposing a plastic layer in each of the cavities of the first molding die member, disposing the solder ball on the plastic layer, causing the solder ball to be deformed on the plastic layer by engaging the first molding die member with the second molding die member, and filling up a gap between the first molding die member and the second molding die member with a sealing resin, thereby fabricating the semiconductor package. Further, in the step of sealing, the sealing resin inside the respective cavities is prevented from covering the surface of the respective solder balls.

With the conventional method of fabricating the conventional semiconductor package as described above, however, in order to ensure electrical connection between respective leads and the respective solder balls, the respective solder balls are connected beforehand to the respective leads of the lead frame, corresponding thereto, prior to the step of the sealing with the resin.

As a result of such work for connecting the respective solder balls with the respective leads, both are connected with each other with certainty. However, since such connection of the solder balls is implemented through fusion of the solder balls by heating, the surfaces of the solder balls get oxidized when the solder balls are exposed to a high temperature. Furthermore, with the conventional method as described above, the respective solder balls are subjected to heating through the intermediary of both the first and second molding die members again in the step of the sealing with the resin as described above. As a result of such heating applied twice, the respective solder balls serving as respective connection terminals are prone to growth of an oxide film on the surface thereof, and such growth of the oxide film is detrimental to reliable and easy soldering work between the respective solder balls and printed wiring when mounting the semiconductor package on, for example, a printed wiring board. Accordingly, in order to enable the reliable and easy soldering work to be implemented, there are times when a step of removing the oxide film from the surface of the respective solder balls is required prior to the soldering work.

Further, with the conventional method as described above, there is the need for using a special type plastic layer free from a risk of bonding with a resin material and the solder balls in order to prevent intrusion of the resin material into a gap formed between the respective cavities of the first molding die member and the respective solder balls, and further, the steps of disposing the special type plastic layer inside the respective cavities, and peeling off the same are required, resulting in an increase in material cost, and complexity in a fabrication process, and thereby raising a risk of an increase in fabrication cost.

SUMMARY OF THE INVENTION

It is therefore an object of the invention to provide a semiconductor package wherein oxidation of the surface of solder balls is minimized.

It is another object of the invention to provide a method of fabricating the semiconductor package wherein oxidation of the surface of the solder balls is minimized.

It is still another object of the invention to provide a method of fabricating the semiconductor package wherein intrusion of a resin material for sealing around the solder balls can be prevented in a sealing process by use of the resin material.

According to one aspect of the invention, in order to achieve the objects as described above, there is provided a method of fabricating a semiconductor package comprising a step of preparing a lead frame provided with a spherical terminal, a step of preparing a first molding die member having a cavity with a through hole defined in the bottom thereof, a step of preparing a second molding die member to be engaged with the first molding die member, a step of holding the lead frame between the first and second molding die members such that the spherical terminal is disposed in the cavity, a step of sucking in the spherical terminal via the through hole, and a step of injecting a molding composition between the first and second molding die members.

The above and further objects, and novel features of the invention will be more fully apparent from the following detailed description, appended claims and accompanying drawings.

DETAILED DESCRIPTION OF THE PREFERRED EMBODIMENTS

Embodiments of the invention are described in detail hereinafter with reference to the accompanying drawings.

First Embodiment

Figure 1:
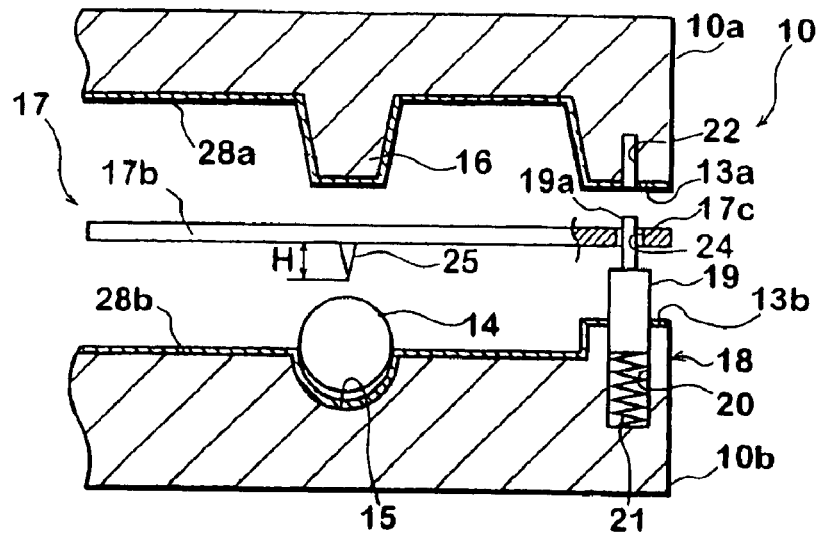
FIGS. 1A–1C are views showing the steps of fabricating in a first embodiment of a method of fabricating a semiconductor package according to the invention.
Figure 1:
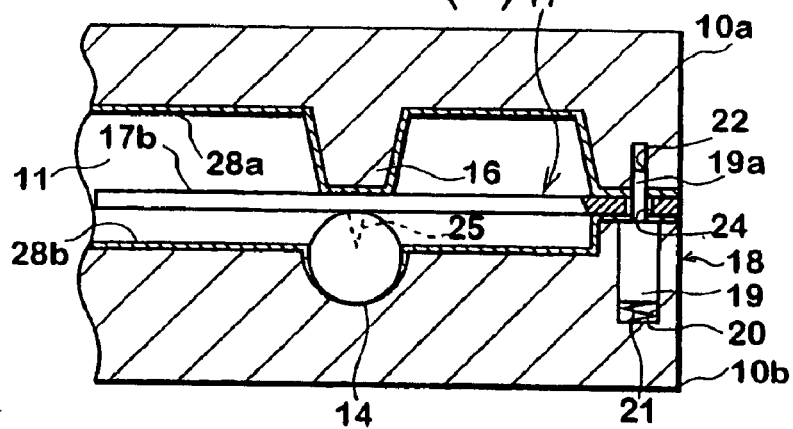
Figure 1:
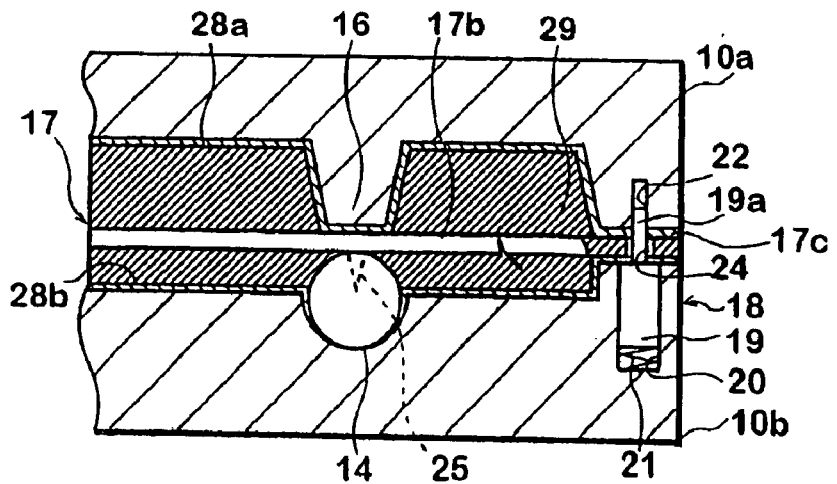

FIG. 1 shows a first embodiment of a method of fabricating a semiconductor package according to the invention.

As shown in FIG. 1(A), with the first embodiment of the method of fabricating the semiconductor package according to the invention, use is made of a molding die 10 comprising an upper molding die member 10a, and a lower molding die member 10b having a cavity 11.

Both the upper and lower molding die members 10a, 10b, composing the molding die 10, have die faces 13a, 13b, respectively, which are disposed opposite to each other, and are movably held together in such a way as to allow the die faces 13a, 13b to move in a direction in which the die faces 13a, 13b approach each other as well as in a direction in which the die faces 13a, 13b move away from each other while being retained by a clamping mechanism (not shown) so as to be mutually tightened up.

A recess 15 hemispherical in section for receiving a solder ball 14 for serving as a connection terminal of a package is formed on the die face 13b of the lower molding die member 10b as a first molding die member in such a way as to be opened up in the cavity 11. Meanwhile, a press-down part 16 is formed at a position on the die face 13a of the upper molding die member 10a as a second molding die member, corresponding to the position of the recess 15. The press-down part 16 is provided on the die face 13a of the upper molding die member 10a, and is constructed in such a way as to protrude towards the die face 13b disposed opposite to the die face 13a.

Further, a placement system 18 for positioning a lead frame 17 which is to serve as an electrically conductive member for a semiconductor integrated circuit package is installed between the respective die faces 13a, 13b of the molding die members 10a, and 10b.

With the embodiment of the invention as shown in FIG. 1, the placement system 18 comprises a guide hole 20 for accommodating a positioning pin 19 so as to be protrudable from the die face 13b of the lower molding die member 10b, provided in the lower molding die member 10b, an elastic member 21 made up of a coil spring, for imparting a bias force to the positioning pin 19 disposed inside the guide hole 20 towards the protrusion position thereof, and a receptacle 22 provided on the die face 13a of the upper molding die member 10a so as to be able to receive an extremity 19a which is a necked-down part of the positioning pin 19.

The lead frame 17 is made of a metallic material, and comprises a support 17a (refer to FIG. 2) for mounting a semiconductor chip thereon, a plurality of leads 17b to be connected to a plurality of bonding wires 23 (refer to FIG. 2) extending from the semiconductor chip, respectively, and a peripheral part 17c for mutually connecting the leads 17b with each other. A matching hole 24 for allowing the extremity 19a of the positioning pin 19 to penetrate therethrough is defined in the peripheral region of the lead frame 17. Further, protrusions 25 having a tapered tip are formed on a face of the lead frame 17, opposite to the die face 13b.

In FIG. 1(A), only one of the protrusions 25 in a tapered or wedge-like shape is shown, however, each of the protrusions 25 is formed at a position corresponding to the recess 15 of the respective leads 17b. The height H of the respective protrusions 25 preferably has a size equivalent to about 10 to 50% of the size of the diameter of the respective solder balls 14 in order to ensure bonding without damaging the respective solder balls 14 when the protrusions 25 pierce the solder balls 14, respectively.

As shown in FIG. 1(A), with both the upper and lower molding die members 10a and 10b in as-disengaged state, the solder ball 14 is placed in the recess 15 provided in the lower molding die member 10b. The solder ball 14 can be formed of a eutectic solder in a spherical shape, composed of tin and lead, or an alloy in a spherical shape, composed of tin, silver, and copper, such as the so-called lead-free solder.

After the placement of the solder ball 14, the lead frame 17 is disposed between the upper and lower molding die members 10a, 10b such that the matching hole 24 of the lead frame 17 can allow the positioning pin 19 of the placement system 18 to penetrate therethrough.

As a result of disposing the lead frame 17 by use of the placement system 18, the positioning of the lead frame 17 can be implemented between the upper and lower molding die members 10a, 10b such that the protrusion 25 provided on the respective leads 17b of the lead frame 17 is disposed opposite to the solder ball 14 corresponding thereto.

Figure 2:
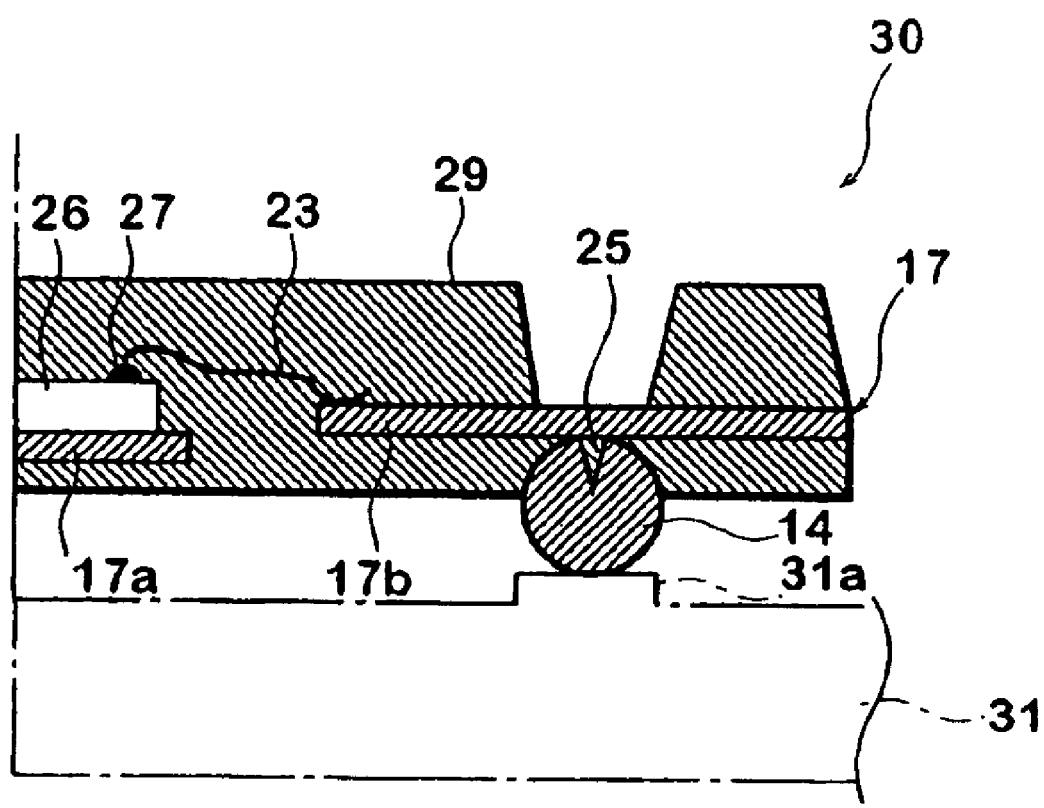
FIG. 2 is a partly sectional view of the semiconductor package obtained by the first embodiment of the method of fabricating the semiconductor package.

Although not shown in FIG. 1(A) for brevity in illustration, prior to the placement of the solder ball 14 and the lead frame 17 between the upper and lower molding die members 10a, 10b, the semiconductor chip 26 is fixedly attached to the support 17a of the lead frame 17 beforehand as shown in FIG. 2, and a pad 27 which is an electric terminal of the semiconductor chip 26 is connected to the respective lead 17b via the respective bonding wires 23, corresponding thereto.

With the first embodiment shown in FIG. 1(A), prior to the placement of the solder ball 14 and the lead frame 17 in the molding die 10, the respective die faces 13a, 13b of the molding die members 10a, 10b are covered with plastic layers 28a, 28b which are thermally deformable, and formed of, for example, ethylene fluoride copolymer, respectively.

With the molding die 10 in opened-up state, the upper and lower molding die members 10a, 10b with the solder ball 14 and the lead frame 17 disposed therebetween are moved to a clamping position where the die faces 13a, 13b are mutually tightened up in a clamping step as shown in FIG. 1(B), and are retained in the clamping position by the clamping mechanism.

The respective molding die members 10a, 10b are preheated to a temperature in a range of, for example, 150 to 220 C, and when both the upper and lower molding die members 10a, 10b are tightened up together by the clamping mechanism, the press-down part 16 provided on the upper molding die member 10a presses down the respective solder balls 14 corresponding to the protrusion 25 of the respective leads 17b towards the inside of the recess 15. The respective solder balls 14 in an atmosphere preheated to a high temperature are pressed down by the protrusion 25 of the respective leads 17b in a atmosphere similarly preheated to a high temperature, whereupon the respective solder balls 14 allow the respective protrusions 25 to penetrate the same.

Accordingly, in the clamping step, the protrusions 25 of the respective leads 17b penetrates the respective solder balls 14, corresponding thereto in an atmosphere at a high temperature, and the respective leads 17b are soldered to the respective solder balls 14 (and mainly with the respective protrusions 25). As a result, the solder balls 14 are securely bonded electrically and mechanically.

Further, in the clamping step, the solder ball 14 pushes out portions of the plastic layer 28b, positioned between the solder ball 14 and the recess 15 accommodating the solder ball 14, from the recess 15. As a result, residual portions of the plastic layer 28b, remaining between the solder ball 14 and the recess 15 without being pushed out by the solder ball 14, fill up a gap formed between the surface of the solder ball 14 and the sidewall face of the recess 15.

In a sealing step, subsequent to the clamping step, a resin material is fed into the cavity 11 defined between the respective die faces 13a, 13b of both the molding die members 10a and 10b as shown in FIG. 1(C).

In the sealing step, the lead 17b is in a state wherein it is securely bonded to the solder ball 14, corresponding to the protrusion 25 thereof, via the protrusion 25, and as shown in FIG. 2, the lead 17b together with a part of the solder ball 14, the semiconductor chip 26, and the bonding wire 23 are covered by the resin material, thereby forming a sealing member 29 following curing of the resin material.

Further, in the sealing step, the resin material is prevented from flowing into the gap between the surface of the solder ball 14 and the sidewall face of the recess 15 by the residual portions of the plastic layer 28b, filling up the gap between the surface of the solder ball 14 and the sidewall face of the recess 15, so that generation of a burr, that is, flash, covering the solder ball 14, can be prevented.

When removing the sealing member 29 formed as a result of curing of the resin material from both the upper and lower molding die members 10a, 10b in as-disengaged state, the plastic layers 28a, 28b facilitate peeling off of the sealing member 29 from both the upper and lower molding die members 10a and 10b.

After the sealing member 29 is taken out of both the upper and lower molding die members 10a and 10b, the peripheral part 17c of the lead frame 17, exposed from the sealing member 29, is cut off, and thereby the respective leads 17b are electrically separated from each other. Thus, as shown in FIG. 2, a ball grid array package 30 according to the invention is formed.

With the method of fabricating the semiconductor package according to the invention, there is no need for keeping the respective leads 17b of the lead frame 17, in a state as bonded to the respective solder balls 14, prior to the disposition of the lead frame 17 between the upper and lower molding die members 10a and 10b. Instead, secure bonding of both can be implemented in the clamping step for tightening up the upper and lower molding die members 10a, 10b by forming beforehand the protrusion 25, functioning as a bonding promoter, on the respective leads 17b.

Accordingly, since the respective solder balls 14 are exposed to the atmosphere at a high temperature only in the clamping step, growth of an oxide film on the surface of the respective solder balls 14 as occurred in the past can be checked in comparison with the case of the conventional method.

As a result, when soldering the respective solder balls 14 of the semiconductor package 30 to, for example, a connection 31a of a printed wiring board 31, it is possible to prevent faulty connection from occurring due to insufficient wettability.

Accordingly, with the method of fabricating the semiconductor package according to the invention, it is possible to fabricate with relative ease the semiconductor package 30 wherein the respective solder balls 14 are reliably and securely bonded to the respective leads 17b, and further, growth of an oxide film on the respective solder balls 14, interfering with soldering, can be checked.

The plastic layers 28a, 28b may be dispensed with. However, the plastic layers 28a, 28b covering the respective die faces 13a, 13b of the respective molding die members 10a and 10b are preferably used as described in the foregoing in order to facilitate peeling off of the sealing member 29 from both the molding die members 10a and 10b, and to prevent generation of burrs covering the respective solder balls 14.

Second Embodiment

FIG. 3 shows a second embodiment of a method of fabricating a semiconductor package according to the invention, wherein a plated face 125 made up of a solder layer, serving as a bonding promoter, is formed on respective leads 17a. In FIG. 3, parts corresponding to those in FIG. 1 are denoted by like reference numerals.

Figure 3A:
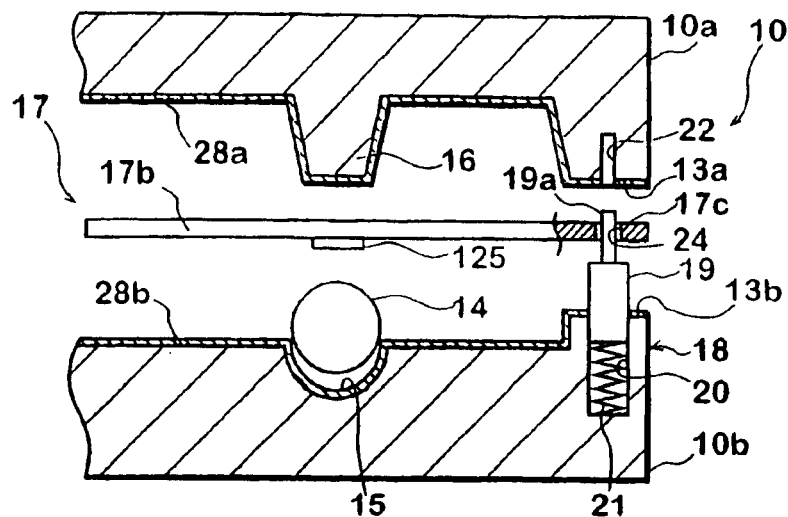
FIGS. 3A–3C are views showing the steps of fabricating in a second embodiment of a method of fabricating a semiconductor package according to the invention.

As shown in FIG. 3(A), the same material as a solder material for a solder ball 14 is applied to a part of the respective leads 17a of a lead frame 17, corresponding to a recess 15, thereby forming the plated face 125.

Figure 3B:
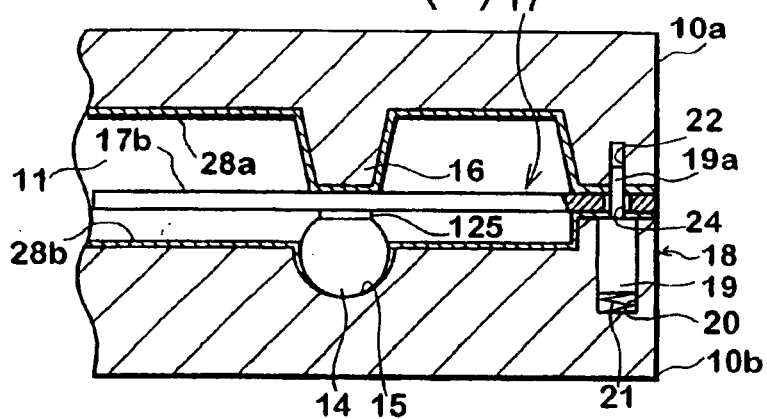

As shown in FIG. 3(B), the plated face 125 made of such a solder material as described is pressed onto the solder ball 14 through the intermediary of the is lead 17b by a pressdown part 16 provided on an upper molding die member 10a when both the upper molding die member 10a and a lower molding die member 10b are tightened up in a clamping step as with the case of the first embodiment of the invention.

In the clamping step, the lead frame 17 and the solder ball 14 are kept in an atmosphere at a high temperature by the agency of both the upper and lower molding die members 10a and 10b which are subjected to preheating. As a result, the plated face 125 provided on the lead 17b is caused to be in a semi-fusion state in an atmosphere at a high temperature, so that the lead 17b is soldered to the solder ball 14 opposite thereto through the intermediary of the plated face 125, thereby being reliably and securely bonded with the solder ball 14.

Figure 3C:
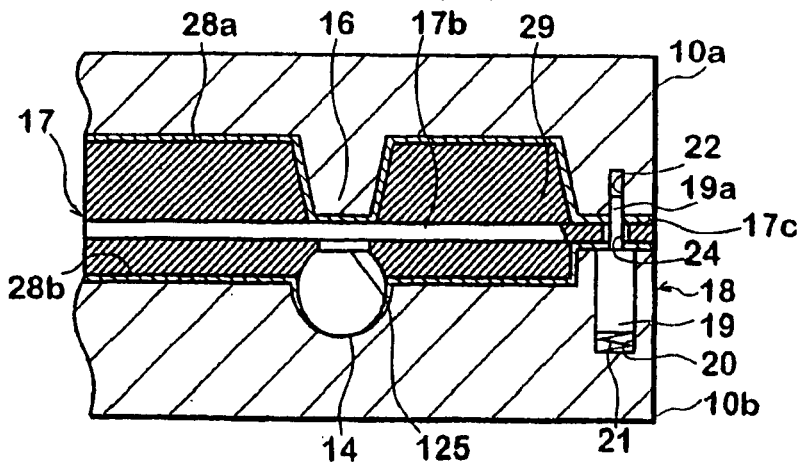

In a sealing step, subsequent to the clamping step, a resin material is fed into a cavity 11 defined between respective die faces 13a, 13b of both the molding die members 10a and 10b as shown in FIG. 3(C).

Figure 4:
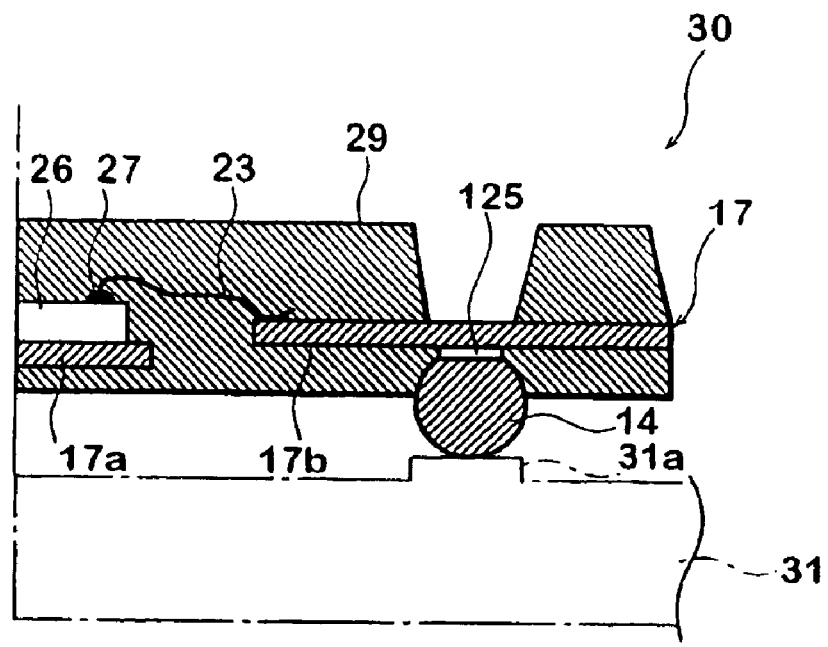
FIG. 4 is a partly sectional view of the semiconductor package obtained by the second embodiment of the method of fabricating the semiconductor package.

In the sealing step, the lead 17b is in a state wherein it is securely bonded to the solder ball 14, corresponding to the plated face 125 of the lead 17b, through the intermediary of the plated face 125, and as shown in FIG. 4, the lead 17b together with a part of the solder ball 14, a semiconductor chip 26, and a bonding wire 23 are covered by the resin material, thereby forming a sealing member 29 following curing of the resin material.

Thereafter, a peripheral part 17c of the lead frame 17, exposed from the sealing member 29, is cut off, thereby electrically separating the respective leads 17b from each other. Thus, as shown in FIG. 4, a ball grid array package 30 according to the invention is formed.

With the second embodiment of the method of fabricating the semiconductor package according to the invention as shown in FIG. 3, there is shown a case where plastic layers 28a, 28b covering the respective die faces 13a, 13b of both the molding die members 10a and 10b are used as with the case of the first embodiment. The plastic layers 28a, 28b, however, may be dispensed with as with the case of the first embodiment.

In the clamping step, the bonding promoter made up of the plated face 125 contributes to reliable and secure bonding of the respective leads 17b of the lead frame 17 with the respective solder balls 14, corresponding thereto. As compared with the protrusion 25 shown in the first embodiment, the plated face 125 is not required to be protruded in a more pronounced way, so that the lead frame 17 provided with the bonding promoter as described can be handled with greater ease during disposing work for disposing the lead frame 17 in a molding die 10, and so forth.

Third Embodiment

Figure 5:
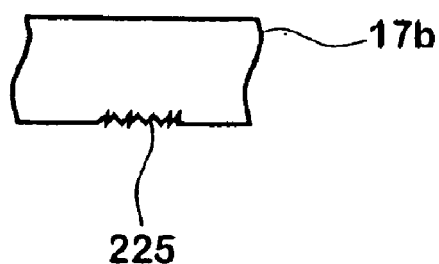
FIG. 5 is a partly enlarged sectional view of a third embodiment of a method of fabricating a semiconductor package according to the invention, showing a part of a lead frame.

FIG. 5 shows a bonding promoter 22S contributing to easier handling of a lead frame 17, similar to that in the second embodiment. This constitutes a third embodiment of a method of fabricating a semiconductor package according to the invention.

FIG. 5 is a partly expanded view of a lead 17b, similar to a part of the lead 17b provided with the plated face 12S as shown in FIG. 3(A).

The bonding promoter 22S according to the third embodiment of the invention, shown in FIG. 5, is made up of a rough face 22S formed on the surface of the lead 17b, on one side thereof. Such a rough face as described can be formed by providing the surface of the lead 17b with scratches, mechanical working through striking the surface with fine particles, or chemical working through localized corrosion caused by use of a chemical liquid, for example, sulfuric acid.

In the clamping step, the bonding promoter made up of the rough face 22S contributes to reliable and secure bonding of the respective leads 17b of the lead frame 17 with the respective solder balls 14, corresponding thereto, as with the case of the plated face 12S. Further, in comparison with the protrusion 25 shown in the first embodiment, the rough face 22S is not required to be protruded in a more pronounced way as with the case of the plated face 12S, so that according to the third embodiment, the lead frame 17 provided with the bonding promoter as described can be handled with greater ease during disposing work for disposing the lead frame 17 in a molding die 10, and so forth.

Fourth Embodiment

Figure 6A:
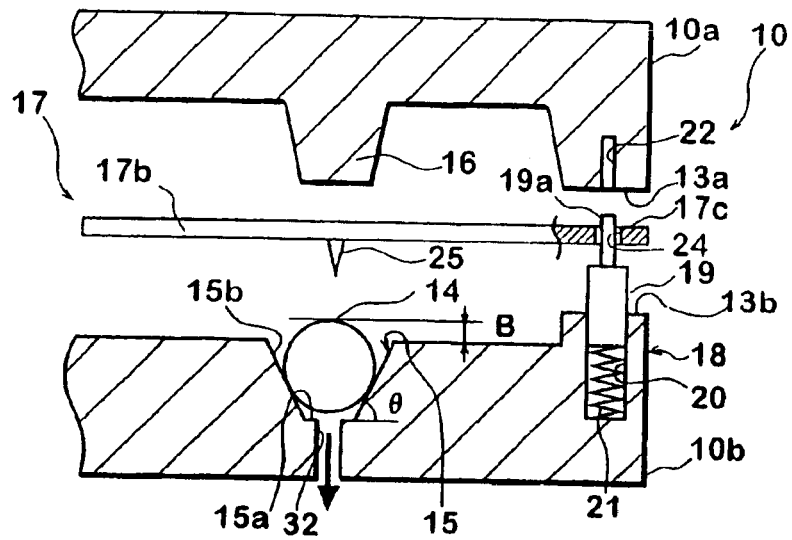
FIGS. 6A–6C are views showing the steps of fabricating in a fourth embodiment of a method of fabricating a semiconductor package according to the invention.
Figure 6B:
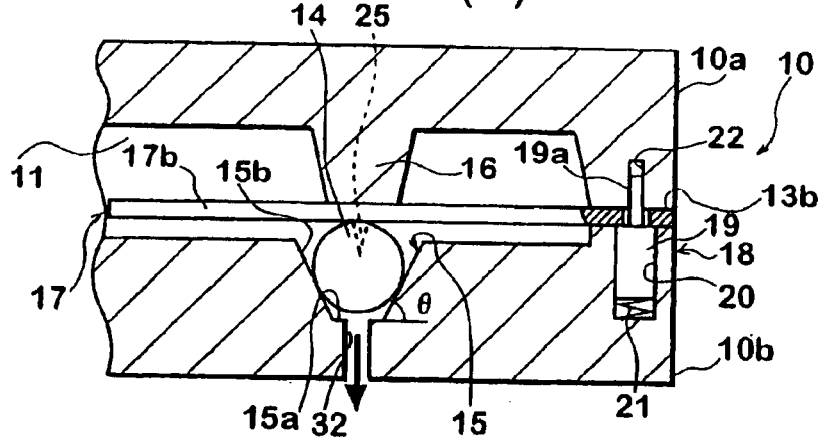
Figure 6C:
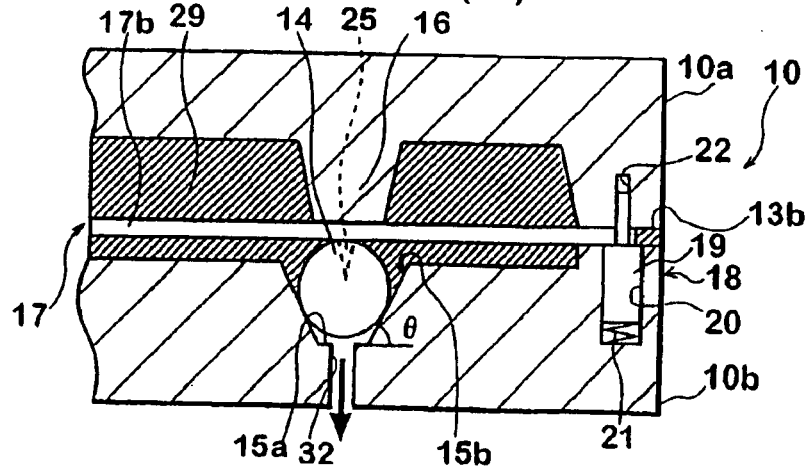

With a fourth embodiment of a method of fabricating a semiconductor package according to the invention, shown in FIGS. 6(A) to 6(C), a recess 15 for accommodating a solder ball 14, formed in a lower molding die member 10b as a first molding die member of a molding die 10 that also includes an upper molding die member 10a, configured as a tapered hole. The previously described plastic layer 28b is not disposed inside the tapered hole 15.

As shown in FIG. 6(A), the tapered hole 15 is defined by a bottom face 15a in the shape of a circle of a diameter smaller than that of the solder ball 14, and a slanted inner peripheral face 15b rising at a taper angle è from the bottom face 15a such that the bore of the tapered hole 15 gradually increases towards a die face 13b of the lower molding die member 10b. As for the tapered hole 15, the diameter of the bottom face 15a, the taper angle è of the slanted inner peripheral face 15b and the depth size thereof are set approximately such that the apex of the solder ball 14 is exposed from the die face 13b towards a cavity 11 to a height B equivalent to 10 to 20% of the diameter of the solder ball 14 when the solder ball 14 is placed inside the tapered hole 15.

The solder ball 14 is disposed directly inside the tapered hole 15 without a plastic layer 28b interposed therebetween so as to be in contact with the slanted inner peripheral face 15b of the tapered hole 15. The solder ball 14, the surface of which is in contact with the slanted inner peripheral face 15b of the tapered hole 15, is able to air-tightly seal between the solder ball 14 and the slanted inner peripheral face 15b.

With the embodiment shown in FIG. 6(A), in order to further the enhance sealing performance between the solder ball 14 and the slanted inner peripheral face 15b of the tapered hole 15 receiving the solder ball 14, a negative pressure connection path 32 connected with a negative pressure source (not shown) is opened up in the bottom face 15a of the tapered hole 15.

The solder ball 14 is caused to stick fast to the slanted inner peripheral face 15b of the tapered hole 15 with certainty by the agency of a negative pressure acting on the bottom face 15a of the tapered hole 15 via the negative pressure connection path 32. By virtue of the placement system 18 described in the foregoing, the positioning of the lead frame 17 can be implemented such that a protrusion 25 serving as a bonding promoter provided on the respective leads 17b of the lead frame 17 is disposed opposite to the tapered hole 15, that is, the solder ball 14 placed inside the tapered hole 15.

In a clamping step after disposing the solder ball 14 and the lead frame 17 in the molding die 10 as described above, both the upper and lower molding die members 10a and 10b are retained in a clamping position thereof as shown in FIG. 6(B). In the clamping position, the protrusion 25 and the solder ball 14 are kept in an atmosphere at a high temperature as with the cases of the previously described embodiments, and the protrusion 25 is subjected to a press-down force acting towards the solder ball 14, exerted by a press-down part 16 provided on the upper molding die member 10a through the intermediary of the lead 17b.

Accordingly, in the clamping step, the respective leads 17b are securely bonded to the respective solder balls 14 electrically and mechanically when the protrusion 25 of the respective leads 17b penetrates the respective solder balls 14, corresponding thereto.

In a sealing step, subsequent to the clamping step, a resin material is fed into the cavity 11 defined between the respective die faces 13a, 13b of both the molding die members 10a and 10b as shown in FIG. 6(C).

In the sealing step, the lead 17b is in a state wherein the protrusion 25 thereof is securely bonded to each of the solder balls 14, corresponding thereto, and as with the previously described embodiments, the lead 17b together with a part of the solder ball 14, and the same semiconductor chip and bonding wire, as previously described, are covered by the resin material, thereby forming a sealing member 29 following curing of the resin material.

In the sealing step, the solder ball 14 is in air-tight contact with the slanted inner peripheral face 15b of the tapered hole 15, and is also caused to stick fast to, and to be retained by the slanted inner peripheral face 15b with certainty by the agency of the negative pressure. Accordingly, the resin material is prevented from intruding underneath the solder ball 14 through a gap between the slanted inner peripheral face 15b of the tapered hole 15 and the solder ball 14. For this reason, the intrusion of the resin material underneath the solder ball 14 can be prevented without disposing the previously described plastic layer 28b inside the recess 15.

Thus, with the method of fabricating the semiconductor package according to the fourth embodiment, it is possible to fabricate with relative ease a semiconductor package wherein the respective solder balls 14 are reliably and securely bonded to the respective leads 17b, and growth of an oxide film on the respective solder balls 14, interfering with soldering, can be checked. In addition, generation of burrs covering the solder balls 14 can be prevented without the use of a filler (made up of the previously described plastic layer) placed inside the recess 15 in order to prevent the resin material from passing through a gap between the sidewall face of the recess 15 and the solder ball 14.

With the embodiment described above, neither the die face 13a of the molding die members 10a nor the die face 13b of the molding die member 10b is covered by the plastic layer (28a and 28b), however, the same plastic layer as previously described may be disposed as necessary on the die face 13a of the upper molding die members 10a in order to facilitate peeling off of the sealing member 29, or the same plastic layer as previously described may be disposed as necessary on the die face 13b of the lower molding die member 10b, excluding the tapered hole 15, in order to facilitate peeling off of the sealing member 29.

Fifth Embodiment

In the case of the fourth embodiment of the invention as shown in FIGS. 6(A) to 6(C), there is shown an example where the lead 17b is provided with the bonding promoter.

Figure 7A:
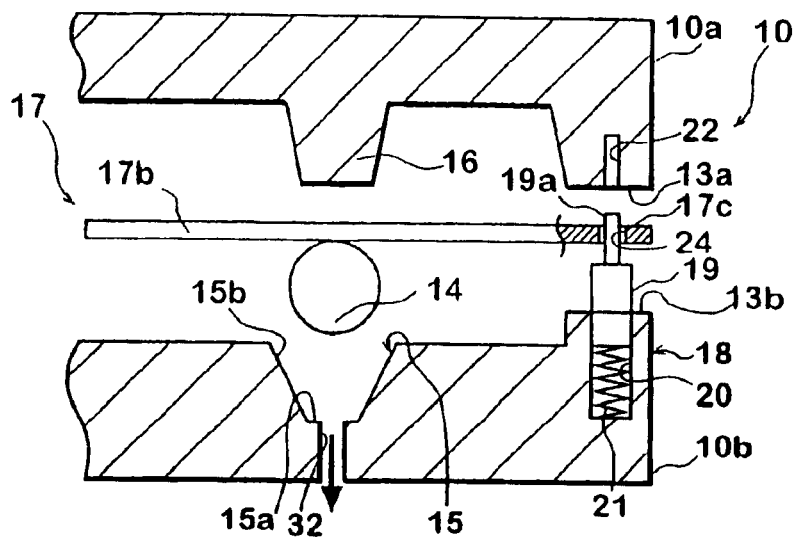
FIGS. 7A–7C are views showing the steps of fabricating in a fifth embodiment of a method of fabricating a semiconductor package according to the invention.
Figure 7B:
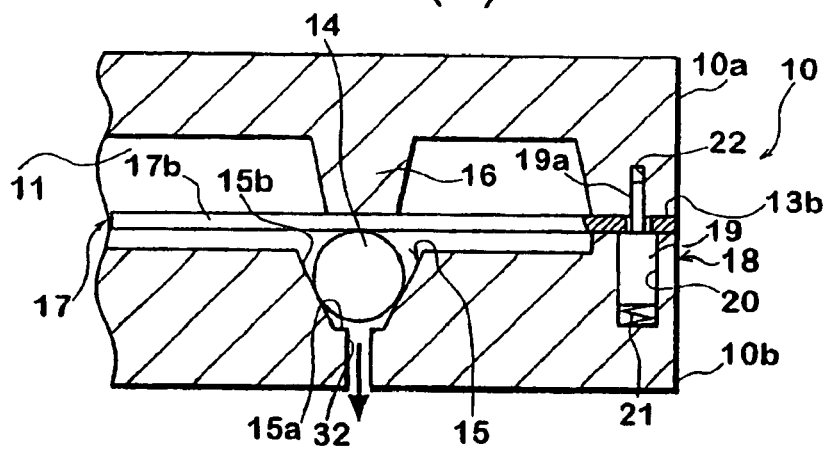
Figure 7C:
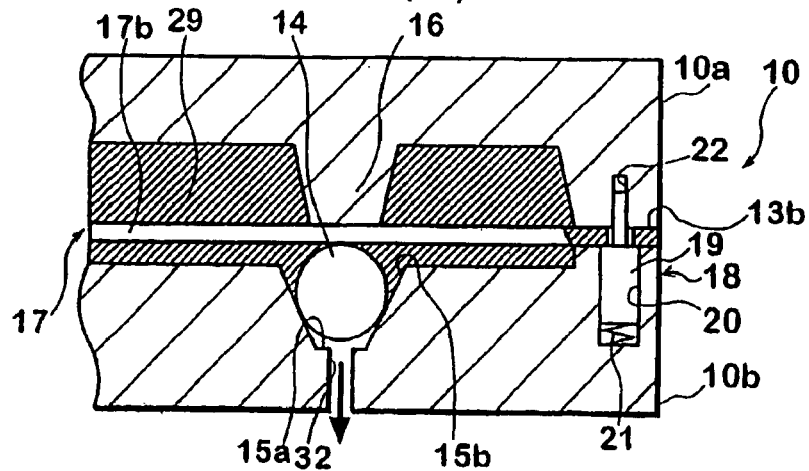

With a fifth embodiment of a method of fabricating a semiconductor package according to the invention, however, a solder ball 14 can be soldered to a predetermined spot of a lead 17b beforehand as shown in FIGS. 7(A) to 7(C) without forming the previously described bonding promoter on the respective leads 17b of the lead frame 17 as with the embodiments described in the foregoing.

As shown in FIG. 7(A), a recess 15 made up of the same tapered hole as shown in the fourth embodiment is formed on a lower molding die member 10b as a first molding die member. A negative pressure can be introduced into the tapered hole 15 via a negative pressure connection path 32.

With the method according to the fifth embodiment of the invention, since the solder ball 14 is bonded to the lead 17b beforehand, the positioning of the lead frame 17 can be implemented such that the solder ball 14 is opposed to the tapered hole 15 as predetermined by disposing the lead frame 17 with the use of the placement system 18.

As shown in FIG. 7(B), in a clamping step, the solder ball 14 is pressed down towards a slanted inner peripheral face 15b of the tapered hole 15 by a press-down part 16 provided on an upper molding die member 10a as a second molding die member as with the case of the fourth embodiment, and also is caused to stick fast to, and retained by the slanted inner peripheral face 15b of the tapered hole 15 with certainty by the agency of a negative pressure applied via the negative pressure connection path 32.

Accordingly, in a sealing step shown in FIG. 7(C), as with the case of the fourth embodiment, the solder ball 14 is in air-tight contact with the slanted inner peripheral face 15b of the tapered hole 15, and is also caused to stick fast to, and to be retained by the slanted inner peripheral face 15b with certainty by the agency of the negative pressure as previously described. Accordingly, the resin material as previously described is prevented from intruding underneath the solder ball 14 through a gap between the slanted inner peripheral face 15b of the tapered hole 15 and the solder ball 14, so that the intrusion of the resin material underneath the solder ball 14 can be prevented.

When the solder ball 14 is caused to stick fast to, and to be retained by the slanted inner peripheral face 15b with certainty by a sucking force caused by a negative pressure introduced into the tapered hole 15 via the negative pressure connection path 32, the press-down part 16 provided on the upper molding die member 10a can be dispensed with.

With the fifth embodiment of the invention, as described in the foregoing, generation of burrs covering the solder balls 14 can be prevented without the use of a filler (made up of the previously described plastic layer) placed inside the recess 15 in order to prevent the resin material passing through a gap between the sidewall face of the recess 15 and the solder ball 14.

However, because the solder ball 14 is already soldered to the lead 17b prior to the sealing step by use of the resin material, and is exposed again to an atmosphere at a high temperature during the sealing step by use of the resin material, the surface of the solder ball 14 is prone to the formation of an oxide film.

Accordingly, in order to check oxidation occurring to the surface of the solder ball 14, and to facilitate soldering with the solder ball 14, it is preferable to form the bonding promoter made up of the protrusions 25, the plated face 125, or the rough face 225 as previously described on the lead 17b, and to implement bonding of the lead 17b with the solder ball 14 in the clamping step instead of soldering the solder ball 14 to the lead 17b beforehand as with the fifth embodiment.

In the foregoing, a ball grid array package wherein the semiconductor chip is connected to the leads via the plurality of the bonding wires is described. However, the invention is applicable to not only the ball grid array package but also a flip chip type and other type of ball grid array packages.

With the method of fabricating the semiconductor package according to the invention, since bonding of the bonding promoter provided on the electrically conductive member with the connection terminal corresponding to the bonding promoter can be implemented by the agency of a clamping force of both the upper and lower molding die members under heating, thereby the connection terminal is connected with the electrically conductive member with certainty under heating in the sealing step using resin, and further, since the connection terminal is not exposed twice to an atmosphere at a high temperature, growth of an oxide film on the connection terminal can be checked.

Thus, with the previously described method of fabricating the semiconductor package according to the invention, it is possible to fabricate with relative ease a semiconductor integrated circuit package wherein the electrically conductive member is connected with the connection terminal spherical in shape with certainty, and a semiconductor chip is mounted on a substrate with relative ease as compared with the conventional method.

Further, with the semiconductor integrated circuit package obtained by the method of fabricating the semiconductor package described, since growth of the oxide film on the surface of the connection terminal is checked, it is possible to mount a component on a substrate such as a printed wiring board with ease as well as certainty as compared with the case of the conventional package.

Still further, with the method of fabricating the semiconductor package according to another embodiment of the invention, since the recess for receiving the connection terminal spherical in shape is made up of the tapered hole as described in the foregoing, it is possible to prevent intrusion of the resin material such as a synthetic resin material by taking advantage of airtightness between the slanted inner peripheral face of the tapered hole and the surface of the connection terminal spherical in shape.

Accordingly, with the method of fabricating the semiconductor package according to the invention described, the filler for preventing the resin material from intruding into a gap between the sidewall face of the recess and the solder ball is not used as in other cases, and consequently, intrusion of the resin material around the solder ball can be prevented without bringing about an increase in cost due to the use of the filler.

Thus, the semiconductor integrated circuit package which does not require a deburring work for removing burr of the sealing member, generated due to the intrusion of the resin material around the connection terminal, that is, the solder ball, can be provided at a relatively low cost.

What is claimed is:

1. A semiconductor package, comprising:
   an electrically conductive member having a spherical terminal;
   a semiconductor chip which is electrically connected to said electrically conductive members; and
   a sealing member for sealing said electrically conductive members and said semiconductor chip therein;
   wherein a part of said spherical terminal is exposed from said sealing member, and said spherical terminal is electrically connected to said electrically conductive member via a protrusion formed on said electrically conductive member.

2. A semiconductor package according to claim 1, wherein the electrically conductive members are leads of a lead frame.

3. A semiconductor package according to claim 2, wherein the protrusion has an extremity forming an acute angle.

4. A semiconductor package according to claim 3, wherein the protrusion has a height in size equivalent to about 10 to 50% of the diameter of the spherical terminal.

5. A semiconductor package according to claim 4, wherein the protrusion is caused to pierce the spherical terminal when a press-down force acts between the spherical terminal and the leads.

6. A semiconductor package according to claim 2, wherein the protrusion has an extremity provided with a rough face.

7. A semiconductor package according to claim 6, wherein the protrusion is made up of a plated face.

8. A semiconductor package according to claim 7, wherein the protrusion is connected to the spherical terminal when a press-down force acts between the spherical terminal and the leads.

9. A semiconductor package for a semiconductor chip, comprising:
   a lead;
   means for connecting the lead to the semiconductor chip;
   a solder ball connected to the lead; and
   an injection-molded body in which the semiconductor chip and at least a portion of the lead are embedded, the body having a top portion and a bottom portion, the solder ball protruding through the bottom portion of the body,
   wherein the top portion of the body has a recess directly above the solder ball, the recess exposing the lead.

10. The semiconductor package of claim 9, wherein the lead has a protrusion that extends into the solder ball.

11. The semiconductor package of claim 9, wherein the lead has a locally roughened region that engages the solder ball.

12. The semiconductor package of claim 9, wherein the lead has a thickened region that engages the solder ball.

13. The semiconductor package of claim 12, wherein thickened region is a plated region.

14. A semiconductor package for a semiconductor chip, comprising:
   a lead having a protruding spike;
   means for connecting the lead to the semiconductor chip;
   a solder ball connected to the lead, with the spike extending into the solder ball; and
   an injection-molded body in which the semiconductor chip and at least a portion of the lead are embedded.

15. The semiconductor package of claim 14, wherein the body has a recess directly above the solder ball, the recess exposing the lead.

* * * * *